May 9, 1967 L. O. MESENHIMER 3,319,180
TRANSISTOR INVERTER WITH SEPARATE RELAXATION OSCILLATOR TIMING CIRCUIT
Filed Aug. 9, 1965 2 Sheets-Sheet 1

INVENTOR.
LEE O. MESENHIMER
BY John Howard Smith
ATT'Y

INVENTOR.
LEE O. MESENHIMER
BY John Howard Smith
ATT'Y

United States Patent Office 3,319,180
Patented May 9, 1967

3,319,180

TRANSISTOR INVERTER WITH SEPARATE RELAXATION OSCILLATOR TIMING CIRCUIT

Lee O. Mesenhimer, Lakewood, Ohio, assignor to Lorain Products Corporation, a corporation of Ohio Filed Aug. 9, 1965, Ser. No. 478,365
2 Claims. (Cl. 331—47)

This invention relates to D.-C. to A.-C. inverters and is directed more particularly to such a circuit utilizing transistors.

Transistor oscillators of the saturable transformer type are well known in the art and have been used in many applications in the past. These saturable transformer oscillators have two major faults. First, the switching frequency varies considerably as input voltage varies and, secondly, the transistors are subjected to large surge currents each time the transformer saturates.

The surge current problem has been overcome to some extent by using a relatively small saturable transformer in the feedback circuits of the transistors to effect the switching action. However, the frequency stability is still poor with such an arrangemnt.

Accordingly, it is an object of this invention to provide an improved transistor oscillator in which the transformer is not permitted to saturate and the frequency remains substantially constant despite variations of the D.-C. source voltage.

It is another object of the invention to provide an improved transistor oscillator in which a timing circuit periodically supplies a turn-off pulse to the transistors, causing whichever transistor is conducting to turn off.

It is a further object of the invention to provide a transistor oscillator in which the switching activity of the transistors is effected by turn-off pulses generated in a unijunction transistor oscillator circuit and coupled to the switching transistors through a pulse amplifier transistor.

Still another object of the invention is to provide circuitry of the above character in which the turn-off pulses are transmitted directly from the timing circuit to the switching transistors through a pulse amplifier transistor without requiring pulse transformers or coupling capacitors.

Other objects and advantages of the invention will become apparent from the following description and accompanying drawings in which.

Figure 1:
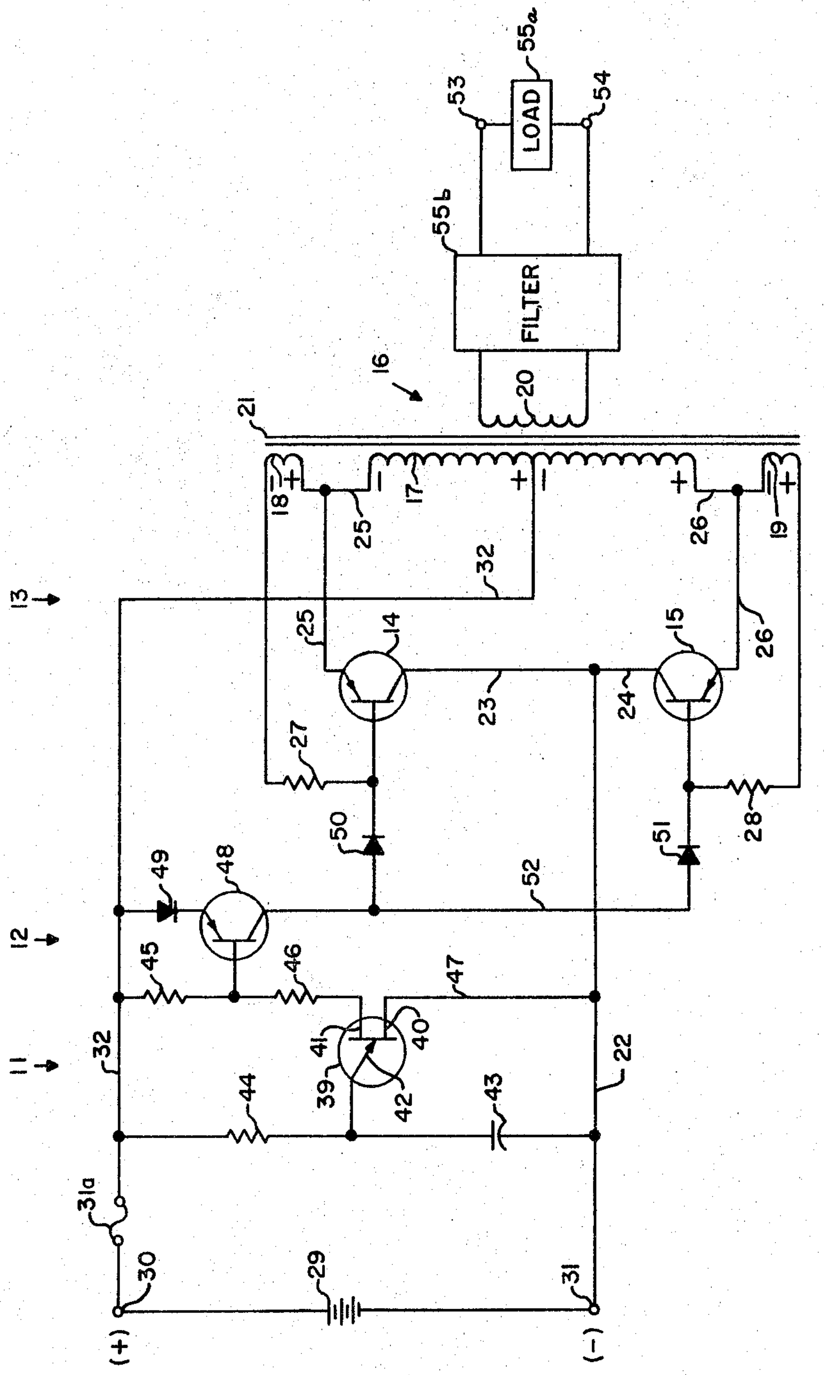
FIGURE 1 is a schematic diagram of the circuitry embodying the invention.

Referring to FIGURE 1, it will be seen that circuitry embodying the invention may include a timing circuit section 11, a pulse amplifying circuit 12 and an oscillator section 13. The oscillator section 13 is formed by switching means such as the P-N-P type transistors 14 and 15 and a transformer 16. This transformer may include a center tapped primary winding 17, feed-back windings 18 and 19 and an output winding 20 all carried on a core 21 which may be provided with an air gap. A voltage regulating section 10 which will be described in conjunction with FIGURE 2 and comprising components identified by the numerals 30 through 38 may be utilized to minimize variations of the oscillator output voltage.

It will be understood that the transistors described herein may be replaced by opposite types if the polarity of the energizing source is reversed.

To the end that an A.-C. current will be generated in the primary winding 17, the collector electrodes of the transistors 14 and 15 are connected to a negative potential lead 22 by means of leads 23 and 24, respectively, while the emitter electrodes of those transistors are connected to opposite ends of the primary winding via leads 25 and 26, respectively. The switching action of the transistors 14 and 15 by which one is rendered conducting when the other turns off is produced by connecting the feedback winding 18 and a feedback resistor 27 serially between the emitter electrode and the base electrode of the transistor 14 and by connecting the feedback winding 19 serially with a feedback resistor 28 between the emitter electrode and the base electrode of the transistor 15.

The oscillator section 13 may be energized from a suitable D.-C. source such as a battery 29 connected between the D.-C. input terminals 30 and 31, the terminal 30 being connected through a fuse 31*a* and a lead 32 to the center tap of the primary winding 17 of the transformer 16. The negative potential of the D.-C. source 29 is applied to the lead 22 which is connected to the terminal 31.

To the end that constant frequency timing pulses will be generated to cause switching of the transistors 14 and 15 the timing section 11 is employd. This section may include a variable resistance device which as utilized may be in the form of a unijunction type transistor 39 having first and second base electrodes 40 and 41, respectively, and an emitter electrode 42. In order to periodically reduce the resistance between the first base electrode 40 and the emitter electrode 42 of the unijunction transistor so that current will flow from the second base electrode to the first base electrode, a capacitor 43 and a resistor 44 are serially connected between the leads 22 and 32. The emitter electrode 42 is connected to a point between the capacitor 43 and a resistor 44 to provide discharge path for the capacitor as will be explained presently.

For the purpose of providing a load means across which there will be developed a voltage pulse each time the resistance between the base electrode 40 and the emitter electrode 42 decreases, a resistor 45 is connected between the lead 32 and one end of a resistor 46, the other end of which is connected to the base electrode 41 of the unijunction transistor. The resistor 46 is not essential to the operation of the circuit but serves to provide temperature compensation. The current path for the unijunction transistor 39 is completed by connecting the base electrode 40 to the lead 22 by the means of a lead 47.

In order to increase the magnitude of the voltage pulses which are produced across the resistor 45, a P-N-P type transistor 48 is incorporated in the pulse amplifier section 12. To control the conduction of the transistor 48, the base electrode thereof is connected to a point between the resistors 45 and 46 and the emitter electrode is connected to the lead 32 through a diode 49. This diode prevents the transistor 48 from being rendered conducting by the quiescent voltage normally present across the resistor 45 due to the current flow from lead 32 to lead 22 through the relatively high interbase resistance of the unijunction transistor 39. The connections by which the amplified voltage pulse is supplied to the transistors 14 and 15 from the transistor 48 are established by a steering diode 50 connected between the base electrode of the transistor 14 and the collector electrode of the transistor 48 and a steering diode 51 connected with a lead 52 between the base electrode of the transistor 15 and the collector electrode of the transistor 48.

The output winding 20 of the transformer 16 is conected to a pair of output terminals 53 and 54 across which there may be connected a load 55*a*. A suitable filter circuit 55*b* may be inserted between the output winding 20 and the load 55*a*. The filter 55*b* is used where the load 55*a* is such as to require a voltage of sinusoidal waveshape.

The operation of the foregoing circuitry will now be described. It will be assumed for purposes of explanation that when the circuit is first energized, the transistor 14 will conduct before the transistor 15 due to random noise in the circuit. Thus when a D.-C. source 29 is connected between the terminals 30 and 31, current will flow from the terminal 30 through the fuse 31*a*, the lead 32, the upper half of the primary winding 17 of the transformer 15, as shown in the figures, the lead 25, the emitter-collector path of the transistor 14, the lead 23 and the lead 22 to the negative terminal 31.

The current flowing through the primary winding 17 of the transformer 16 due to the conduction of the transistor 14 induces a potential on the feedback winding 18 such that the base electrode of the transistor 14 is negative with respect to the emitter electrode thereof. This increases the conduction of transistor 14 to thereby increase the current flow through the primary winding 17 causing the voltage on feedback winding 18 to increase. A cumulative action in which the transistor 14 quickly reaches a fully conducted condition thus ensues. The voltage across the upper portion of the primary winding 17 will be maintained until either the transistor 14 is turned off or the core 21 of the transformer 16 saturates. It is an advantage that in the instant invention the transistor 14 is rendered nonconductive in response to a turn-off signal, as will be described presently, rather than allowing the transformer core 21 to saturate, which saturation would produce high peak currents in the circuit.

Immediately upon the connection of the D.-C. source 29 between the terminals 30 and 31, current will also flow from the terminal 30 to the terminal 31 through a first path comprising the resistor 44 and the capacitor 43 and through a second path formed by the resistors 45 and 46 and the base electrodes 41 and 40 of the unijunction transistor 39. The current traversing the first path charges the capacitor 43 while the current in the second path establishes a quiescent voltage between bases 40 and 41 and on the resistor 45.

As the capacitor 43 charges, the voltage thereacross increases until it exceeds the threshold voltage of the unijunction transistor 39. When this happens, the resistance between the first base electrode 40 and the emitter electrode 42 drops from a high value to a very low value and current flows from the upper to the lower side of the capacitor 43 through the emitter electrode 42, the base electrode 40, the lead 47 and the lead 22. During this period of low resistance between the emitter and base electrode, a current pulse flows from the lead 32 to the lead 22 through the resistor 45, the resistor 46 and base electrodes 41 and 40 of the unijunction transistor 39 and lead 47. The duration of the current pulse traversing the resistors 45 and 46 is relatively short and corresponds to the discharge time of the capacitor 43. Accordingly, the foregoing current pulse produces a voltage pulse across the resistor 45.

This voltage pulse is applied between the base electrode and the emitter electrode of the transistor 48 thereby rendering that transistor conducting. Conduction of the transistor 48 causes current to flow from the positive lead 32 through the diode 49, the emitter-collector path of the transistor 48, the steering diode 50, the resistor 27, and the feedback winding 18 to the negative potential on lead 22 through the emitter-collector path of the transistor 14. This current flow resulting from the conduction of the transistor 48 produces across the resistor 27 a voltage which opposes or bucks the voltage on the feedback winding 18 and reverses the drive voltage of the transistor 14, turning it off.

As soon as the capacitor 43 has discharged, current flow through the resistor 45 ceases and the transistor 48 will, accordingly, turn off. This removes the reverse bias from transistors 14 and 15. The energy stored in the gap of core 21 causes the polarities shown on the windings 17, 18 and 19 of the transformer 16 to reverse from those shown in FIGURE 1. The result of this is that a forward bias is applied to the transistor 15 causing it to conduct. Thus the transistors 14 and 15 have interchanged conducting states.

After the transistors 14 and 15 have switched as just described, they will persist in this condition until the voltage across the capacitor 43 again exceeds the threshold voltage of the unijunction transistor 39. Upon this happening, the capacitor 43 will discharge through the emitter electrode 42 and the base electrode 40 of the unijunction transistors causing the transistor 48 to conduct. The conduction of the transistor 48 produces current flow from the positive lead 32 to the feedback winding 19 of the transistor 15 via the diode 49, the emitter-collector path of the transistor 48, the lead 52, the steering diode 51, and the resistor 28. The voltage developed across the resistor 28 by this current flow causes the transistor 15 to turn off and, as a result, the polarities indicated in FIGURE 1 will appear on the windings 17, 18 and 19. These polarities cause the transistor 14 to turn on. Thus the transistors switch or interchange conducting states, as described previously.

The current traversing the primary winding 17 of the transformer 16 due to the switching action of the transistors 14 and 15 induces a square wave voltage on the secondary winding 20. This square wave voltage is fed to the load 55*a* through a suitable filter 55*b* so that the voltage appearing at the output terminals 53 and 54 is a sinusoidal waveshape. It will be understood that the squarewave voltage appearing on the output winding 20 may be used to drive a controlled rectifier power circuit or any other suitable device such as an amplifier which may supply relatively high power to a load.

Figure 2:
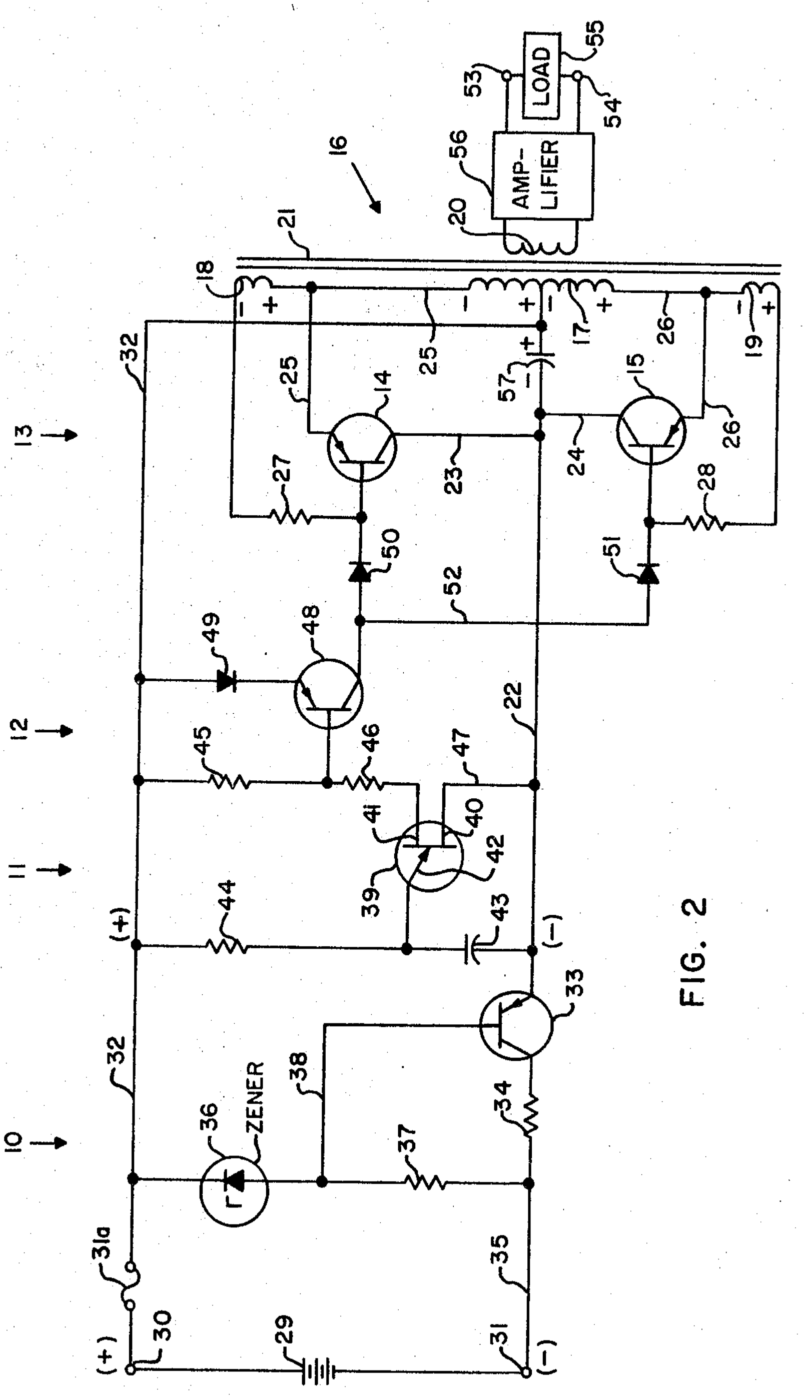
FIGURE 2 is a schematic of the circuitry modified in certain respects.

The circuit of FIGURE 2 is similar to that of FIGURE 1 and like parts are identified by like numerals. In the circuit of FIGURE 2 the voltage signal on the output winding 20 of the transformer 16 is supplied to the load 55*a* through a suitable amplifier 56 which increases the power of the signal.

A voltage regulating section 10 is provided in the circuit of FIGURE 2 to maintain the voltage of the output winding 20 at a relatively constant value and to even further improve the stability of the timing circuit 11. The voltage regulating section 10 includes a P-N-P type regulating transistor 33 having an emitter electrode connected to the lead 22 and a collector electrode connected to the negative terminal 31 through a resistor 34 and a lead 35. To provide drive current and also a constant voltage reference for the transistor 33, a zener diode 36 and a resistor 37 are serially connected between the leads 32 and 35. The base electrode of the transistor 33 is connected to a point between the zener diode 36 and the resistor 37 by means of a lead 38.

From the foregoing described connections it will be seen that the transistor 33 of the voltage regulating section is arranged in an emitter-follower type circuit configuration having a voltage gain of nearly unity. Since the voltage of the zener diode 36 is constant, the voltage between the leads 32 and 22 remains constant in spite of variations in current drawn from the voltage regulating section 10 through the transistor 33.

A capacitor 57 may be connected between the junction formed by leads 22, 23 and 24 and the center tap of the primary winding 17 of the transformer 16 as shown in FIGURE 2. This capacitor serves to suppress voltage spikes produced by the switching action of the transistors 14 and 15. If these voltage spikes were allowed to be superimposed on the voltage between leads 32 and 22 they might cause the frequency of the timing circuit 11 voltage pulses to vary from its substantially constant value.

From the foregoing it will be seen that the circuitry embodying the invention provides an improved square wave D.-C. to A.-C. inverter utilizing switching elements in which the power transformer does not saturate and which requires no saturable feedback transformer. The inverter is very economical and efficient and produces a substantially constant frequency, alternating output voltage.

It will be understood that the embodiments shown herein are for explanatory purposes and may be changed or modified without departing from the spirit and scope of the invention as set forth in the claims appended hereto.

What I claim is:

1. In a D.-C. to A.-C. inverter having D.-C. input terminals and an A.-C. output, in combination, a transformer having a center tapped primary winding, a secondary output winding and feedback windings, an oscillator including a pair of transistors each having collector, base and emitter electrodes, means for connecting the collectors of said transistors, means for connecting respective feedback windings between the respective base and emitter electrodes of respective oscillator transistors, means for connecting the respective emitter electrodes of said oscillator transistors to opposite ends of said primary winding, pulse amplifying means including a transistor having collector, base and emitter electrodes, means for connecting the emitter electrode of said amplifying transistor to the center tap of said primary winding, first and second diodes, means for connecting said first diode between the collector electrode of said amplifying transistor and the base of one of said oscillator transistors, means for connecting said second diode between the collector of said amplifying transistor and the base of the other of said oscillator transistors, said oscillator transistors and said amplifying transistor being similarly poled and said first and second diodes being poled to conduct to the collector of said amplifying transistor, first resistor means, means for connecting said first resistor means between the base and the emitter of said amplifying transistor, unijunction transistor means having an emitter electrode and a pair of base electrodes, means for connecting one of said base electrodes to the base of said amplifying transistor, means for connecting the other of said base electrodes to the collector electrodes of said oscillator transistors, a timing network including a capacitor and a second resistor, means for connecting said capacitor and said second resistor in series network relationship, means for connecting the emitter of said unijunction transistor between said capacitor and said second resistor, means for connecting the outer end of said second resistor to said first resistor, means for connecting the outer end of said capacitor to the collectors of said oscillator transistors, a pair of D.-C. power leads, means for connecting one of said leads to the center tap of said primary winding and means for connecting the other power lead to the collectors of the oscillator transistors.

2. In a D.-C. to A.-C. inverter having D.-C. input terminals and an A.-C. output, in combination a transformer having a center tapped primary winding, a secondary output winding and feedback windings, an oscillator including a pair of transistors each having collector, base and emitter electrodes, means for connecting the collectors of said transistors, means for connecting respective feedback windings between the respective base and emitter electrodes of respective oscillator transistors, means for connecting the respective emitter electrodes of said oscillator transistors to opposite ends of said primary winding, pulse amplifying means including a transistor having collector, base and emitter electrodes, means for connecting the emitter electrode of said amplifying transistor to the center tap of said primary winding, first and second diodes, means for connecting said first diode between the collector electrode of said amplifying transistor and the base of one of said oscillator transistors, means for connecting said second diode between the collector of said amplifying transistor and the base of the other of said oscillator transistors, said oscillator transistors and said amplifying transistor being similarly poled and said first and second diodes being poled to conduct to the collector of said amplifying transistor, pulse generating means, means for connecting the output of the pulse generating means to the base of said amplifying transistor, a pair of D.-C. power leads, means for connecting one of said leads to the center tap of said primary winding and means for connecting the other power lead to the collectors of the oscillator transistors.

References Cited by the Examiner

UNITED STATES PATENTS

| | | | |
|---|---|---|---|
| 2,968,739 | 1/1961 | Mohler | 331—113 |
| 3,056,931 | 10/1962 | Bloomquist et al. | 331—113 |
| 3,176,242 | 3/1965 | Dyer et al. | 331—113 |

ROY LAKE, *Primary Examiner.*

S. H. GRIMM, *Assistant Examiner.*